(12) United States Patent
Brocato

(10) Patent No.: US 9,460,321 B1
(45) Date of Patent: Oct. 4, 2016

(54) ZERO-POWER RECEIVER

(71) Applicant: Sandia Corporation, Albuquerque, NM (US)

(72) Inventor: Robert W. Brocato, Sandia Park, NM (US)

(73) Assignee: Sandia Corporation, Albuquerque, NM (US)

( * ) Notice: Subject to any disclaimer, the term of this patent is extended or adjusted under 35 U.S.C. 154(b) by 170 days.

(21) Appl. No.: 14/464,634

(22) Filed: Aug. 20, 2014

(51) Int. Cl.
| | | |
|---|---|---|
| *H03D 1/00* | (2006.01) |
| *G06K 7/00* | (2006.01) |
| *H03H 9/56* | (2006.01) |
| *H03H 9/64* | (2006.01) |
| *G06K 19/07* | (2006.01) |
| *H04L 27/06* | (2006.01) |
| *G06K 7/10* | (2006.01) |
| *G01J 5/34* | (2006.01) |

(52) U.S. Cl.
CPC ............... *G06K 7/0008* (2013.01); *G01J 5/34* (2013.01); *G06K 7/10079* (2013.01); *G06K 19/0723* (2013.01); *H03D 1/00* (2013.01); *H03H 9/56* (2013.01); *H03H 9/64* (2013.01); *H04L 27/06* (2013.01)

(58) Field of Classification Search
CPC ... G06K 7/0008; G06K 7/10079; G01J 5/34; H04L 27/06
USPC ............. 329/347; 250/339.02, 338.3, 336.1, 250/208.2; 600/476
See application file for complete search history.

(56) References Cited

U.S. PATENT DOCUMENTS

| | | | |
|---|---|---|---|
| 7,397,301 B1 | 7/2008 | Brocato | |
| 2006/0202802 A1* | 9/2006 | Seppa | G06K 7/10079 340/10.3 |

OTHER PUBLICATIONS

Buted R. R.; Zero Bias Detector Diodes for the RF/ID Market; Hewlett Packard Journal, Dec. 1995; pp. 94-98.
Finkenzeller; RFID Handbook: Fundamentals and Applications in Contactless Smart Cards and Identification; Wiley, Second Edition, May 2003; pp. Cover Page-xxii; pp. 22-23 (2.3-2.4.1) and pp. 131-147 (4.2.6-4.2.6.7); Chichester, West Sussex, England.
Mead, C.; Analog VLSI and Neural Systems; First Edition; Aug. 1989; pp. Cover Page-xxii and pp. 43-63 (Chapter 4 Neurons); Addison-Wesley Publishing Company, Inc.; USA.
Schulman et al.; W-Band Direct Detection Circuit Performance With Sb-Heterostructure Diodes; IEEE Microwave and Wireless Components Letters; vol. 14, No. 7; Jul. 2004; pp. 316-318.
Schulman et al.; Sb-Heterostructure Interband Backward Diodes; IEEE Electron Device Letters; vol. 21, No. 7; Jul. 2000; pp. 353-355.
Sklar; Digital Communications, Fundamentals and Applications; Second Edition; Prentice-Hall, Inc.; 2001; pp. Cover Page-xviii and pp. 254-276 (5.3.2-5.5.3); Prentice Hall PTR, Upper Saddle River, NJ.
Syme; Microwave Detection Using GaAs/AIAs Tunnel Structures; GEC Journal of Research; vol. 11; 1993; pp. 12-23.
Tran, N. et al.; Development of Long-Range UHF-band RFID Tag Chip Using Schottky Diodes in Standard CMOS Technology; IEEE Radio Frequency Integrated Circuits Symposium; 2007; pp. 281-284.

* cited by examiner

Primary Examiner — Arnold Kinkead
(74) Attorney, Agent, or Firm — Wendy Koba; Aman Talwar

(57) ABSTRACT

An unpowered signal receiver and a method for signal reception detects and responds to very weak signals using pyroelectric devices as impedance transformers and/or demodulators. In some embodiments, surface acoustic wave devices (SAW) are also used. Illustrative embodiments include satellite and long distance terrestrial communications applications.

20 Claims, 6 Drawing Sheets

ZERO-POWER RECEIVER

STATEMENT OF GOVERNMENT INTEREST

This invention was made with Government support under Contract No. DE-AC04-94AL85000 awarded by the U.S. Department of Energy. The Government has certain rights in the invention.

FIELD

The present invention relates in general to the field of communications and more particularly to signal reception.

BACKGROUND

There are several different types of wireless radio frequency identification (RFID) tags that are really zero-power radios. Currently, most truly unpowered wireless RFID tags only have a range of a few meters. There are long-range, low powered tags that draw energy either from a battery or some other form of localized power. A passive, or zero-power, radio receiver is a receiver that uses no direct electrical power but makes sole use of the power available from a transmitter via the radio spectrum.

Commercial applications for short-range, zero-power radio receivers are already common for RFID tags used in applications ranging from low-cost theft prevention devices in stores and libraries to somewhat more expensive devices used to track shipping containers and pallets in warehouses. A long range, truly zero-power radio receiver has until now been unavailable. Such a radio receiver could solve a number of communication-related problems. Right now, cell phones continually turn their radio receiver circuitry on and off to listen for attempts to be contacted by the cellular base station. Similarly, global positioning satellite (GPS) receivers cycle their receivers on and quickly off to keep track of changes in location. A long range, zero-power radio receiver with sufficient sensitivity would greatly extend battery life in wireless mobile applications.

SUMMARY

An embodiment of the present invention provides a zero power signal receiver having at least a first receiver stage to receive an input, the first receiver stage having a bandpass filter electrically connected to a pyroelectric device having an input resistor and a pyroelectric element thermally coupled to the input resistor, and a detector receiving a detector input from a receiver stage to produce an output. The first receiver stage may be followed by one or more receiver stages. A pyroelectric demodulating detector is disclosed in U.S. Pat. No. 7,397,301 B1, which is hereby incorporated by reference.

In yet another embodiment, the detector produces an output adapted to communicate with biological systems.

In another embodiment, illustrated in FIG. 1, the present invention provides a zero power receiver having an antenna that provides an input signal to a bandpass filter with its output connected to a pyroelectric device having an input resistor to receive the input signal, and a pyroelectric element thermally coupled to the input resistor. The pyroelectric device provides an impedance transformation from the output impedance of the bandpass filter to the input impedance of the detector circuit. In addition, the pyroelectric device provides signal demodulation of any amplitude modulations on the carrier frequency and produces at its output a signal at the baseband frequency. This embodiment is a single stage type of zero power radio receiver, and some other embodiments are two stage zero power radio receivers.

In yet another embodiment, illustrated in FIG. 5, the present invention provides a zero power receiver having an antenna that provides an input signal to a first pyroelectric device having a first input resistor to receive the input signal, and the first pyroelectric element thermally coupled to the first input resistor; a bandpass filter to receive an input from the first pyroelectric element, and a second pyroelectric device having a second input resistor to receive an input from the bandpass filter, and a second pyroelectric element thermally coupled to the second input resistor; and an output circuit to receive an input from the second pyroelectric element and to produce an output signal. The first pyroelectric device provides an impedance transformation from the output impedance of the antenna to the input impedance of the bandpass filter. In addition, the first pyroelectric device provides signal demodulation to an intermediate frequency. The second pyroelectric device performs an impedance transformation from the output impedance of the bandpass filter circuit to the input impedance of the output detection circuit. In addition, the second pyroelectric device provides demodulation to baseband frequency of amplitude modulations on the intermediate frequency signal.

In another embodiment, the present invention provides a zero power receiver having an antenna that provides an input signal to a surface acoustic wave (SAW) device; a first pyroelectric device having a first input resistor to receive an input from the SAW device, and a first pyroelectric element thermally coupled to the first input resistor; a bandpass filter to receive an input from the first pyroelectric element; a second pyroelectric device having a second input resistor to receive an input from the bandpass filter, and a second pyroelectric element thermally coupled to the second input resistor; and an output circuit to receive an input from the second pyroelectric element and to produce an output signal. Both the first and second pyroelectric devices perform amplitude demodulation.

In yet another embodiment, the present invention provides a method of signal reception by using an antenna to receive an input signal; using a first unpowered pyroelectric device to provide an impedance transformation between the output impedance of the antenna and the input impedance of an unpowered bandpass filter in addition to demodulation to an intermediate frequency; using the unpowered bandpass filter to receive an input from the first unpowered pyroelectric device and to provide a filtered input to a second unpowered pyroelectric device; using the second unpowered pyroelectric device to receive the filtered input and to perform amplitude demodulation; and using an unpowered output circuit to receive an amplitude demodulated input from the second unpowered pyroelectric element and to produce an output signal.

BRIEF DESCRIPTION OF THE DRAWINGS

The drawings are for the purpose of illustrating embodiments of the invention.

DETAILED DESCRIPTION

Figure 1:
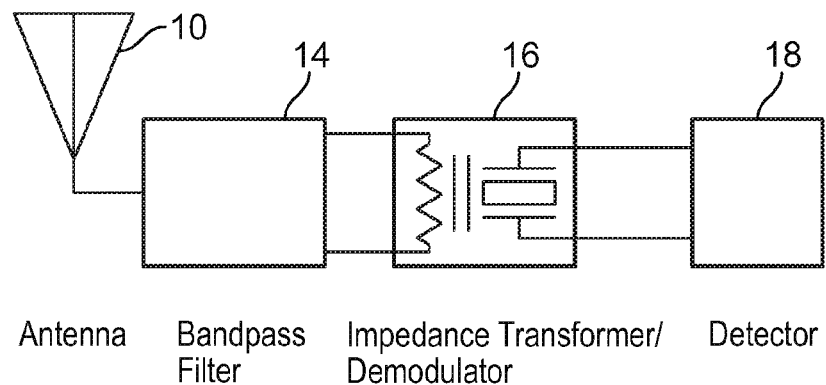
FIG. 1 illustrates the basic elements of a zero power receiver.

A zero-power radio receiver operates relying on four key attributes. The first attribute is reception of the correct radio signal from a radio frequency environment filled with background noise. The second attribute is isolation of that signal from as much of the received noise as possible. The third attribute is that the received signal should undergo an impedance transformation from free space to a much higher impedance. The fourth attribute is the ability to transform the high frequency oscillating received signal into a DC or very low frequency signal such as a baseband signal.

To explain the third attribute in more detail, we will first review some aspects of how radio waves behave. Transmission of radio frequency signals typically occurs in free space or in some facsimile to free space such as air. Electromagnetic waves which travel in free space are generally time-varying oscillations transferring energy back and forth between the electric and magnetic field components. The impedance of free space, 377Ω, creates a balance between electric and magnetic field components that keeps the peak power in each component equal.

To interface to other electronics or biological systems, the electric field component in that material should be made to be much greater than the temperature-induced agitation of localized charges measured in volts and known as the thermal voltage, Vth. The thermal voltage is the average voltage noise induced by thermally excited charges in a material. The thermal voltage in a semiconductor is given by $Vth=kT/q=26$ mV (at room temperature)

This voltage, although small, is much higher than that produced by any but the highest-power radio signals received across a receiving antenna. For example, a typical received terrestrial communication signal of −90 dBm, or 1 picoWatt, produces 27 μV peak across the free space impedance of 377Ω. It takes almost 1 μW, or −30 dBm, i.e. six orders of magnitude more power, to produce a peak voltage equal to Vth across the free-space impedance. Across a dipole antenna with an impedance of 73Ω, it takes almost −23 dBm of received signal power to produce a peak signal voltage equal to the thermal voltage.

A zero-power radio receiver should present an efficient transformation from the receiving impedance environment of free space to a much higher-impedance environment. A received signal of −90 dBm, which produces 27 μV at the free-space impedance of 377Ω, instead produces a peak voltage of 1.4 V across an impedance of $10^{12}\Omega$ if it is losslessly transformed from the free space impedance. A peak voltage of at least 4Vth (=100 mV) is desirable for reliable circuit operation with a low probability of false alarms.

The fourth attribute which a zero-power receiver should possess is the ability to transform the high-frequency oscillating received signal into a DC or very low frequency signal such as a baseband signal. In other words, it should be capable of providing to a circuit connected to its output an unmodulated signal, at baseband frequency. This reception process comprises transforming the received RF signal into an appropriate signal type that is useful to the final end-user of the signal. For a radio, the final signal is an audio signal across, e.g., a high-impedance earphone with enough signal power to be intelligible against the background received noise or spurious signals. For a commercial RFID device, the final signal is a coded stream of bits that have been stripped from an RF carrier signal which has concurrently provided enough power to enable the voltage multipliers to power the chip. For a satellite zero-power radio receiver, the final signal can be a DC voltage exceeding the gate threshold of an FET transistor. This FET transistor can then be used to power-on an identification decoder, store memory bits in a static RAM, or turn on a powered transponder or other devices.

FIG. 1 illustrates the four basic elements of a long-range, zero-power radio receiver, corresponding to the four attributes previously described. These four elements are antenna 10, narrowband filter 14, impedance transformer/demodulator 16, and detector 18. It is not essential that a zero-power radio receiver have all of these elements or have an optimized version of all of these elements, but if any element is lacking or is not optimal, then the receiver will have reduced range and sensitivity.

It is worthwhile to consider each of the elements in the receiver and the role that each plays in signal reception. Each of the basic elements should be optimized for the signal handling that it is required to perform, but it should also interact optimally with any components upstream or downstream from it. Since a true zero-power radio works only with the received RF signal power, no component can increase that signal power, each component can only diminish it. The decrease in signal power through each element should therefore be kept to a minimum.

In radio frequency (RF) engineering terms, this implies that the insertion loss through each component should be kept to a minimum, that impedances should match at all element interfaces, and that noise sources should be carefully excluded from the signal path. This also implies that it is not possible to obtain power gain in the signal path, since no localized source of power is used in a true zero-power receiver. It is possible to obtain voltage gain, process gain, and antenna gain, however. Understanding how these three gains contribute to signal output is useful to understanding a zero-power receiver.

It is also important to consider that a zero-power receiver might use multiple versions of each of the basic elements illustrated in FIG. 1. For instance, the antenna/bandpass filter might be in a multiple-input-multiple-output (MIMO) version to receive simultaneously on different frequencies. An antenna optimized for a certain frequency band might be paired with a matching bandpass filter. Then multiple versions of these parallel antenna/bandpass filter pairs can be connected together into a single demodulator and output detector. This is an example of modification of the circuit shown in FIG. 1 by the use of parallelism.

It is also possible to make serial modifications to the zero-power receiver embodiment illustrated in FIG. 1. For example, a bandpass filter coupled with a matching demodulator can be considered to form a single stage and this can be connected serially to two or more such stages to down-convert the incoming signal without needing to use a mixer. This can, in effect, form a superheterodyne receiver by downconverting a modulated signal to one or more intermediate frequencies (IF) before being finally converted to a baseband signal.

Antenna 10 can be easily the largest physical part of a communication system. Antenna dimensions typically scale in inverse proportion to the frequency of operation and in direct proportion to the gain or directivity of the antenna. The result is that many modern systems are pushed to operate at higher frequencies.

This poses a problem for a zero-power, low power, or RFID receiver systems since the range over which such a device will work is directly proportional to the wavelength of the RF signal used. Lower frequency transmitters can be heard at greater distances than higher frequency transmitters, all other parameters being equal.

There is an additional effect that enables HF and VHF communications to be heard at very great distances. The atmospheric "E" layer can enable a waveguiding effect between earth and sky that can allow signals in these frequency bands to travel many thousands of miles or even all the way around the earth.

However, radio transmission at low frequencies conventionally suffers the disadvantage that dimensions for wavelength-proportional antennas scale inversely with the frequency of operation and can become quite large. For example, a λ/2 dipole at the Iridium satellite transmission frequency of 1.62 GHz has a gain of 2.15 dBi and a size of 9.3 cm (3.6 in). Similarly, a λ/2 dipole at the 40.68 MHz ISM band frequency also has a gain of 2.15 dBi but with a size of 3.7 m (12 ft). It may not be desirable to build a very small, portable radio receiver with a twelve-foot antenna. However, zero-power receivers may be enabled to operate with small-aperture antennas through proper impedance matching to the small-aperture antenna.

It is a well-established fact that very small dipole antennas, those antennas with lengths on the order of $\frac{1}{50}^{th}$ of a wavelength, can be made to have an effective aperture that is similar or even identical to that of a half-wave dipole antenna. One objection to the use of such antennas has been that radiation efficiency for a very small dipole antenna declines somewhat below 100%. Radiation efficiency of an antenna is the ratio of radiation resistance to radiation resistance plus parasitic resistance. It is essentially a measure of power transmitted from an antenna to total power accepted by the antenna. Even with the small antenna resistive losses, however, radiation efficiency can be made to be 70-95%. Thus the impact can be made small and hence relatively unimportant.

A second objection that has hitherto precluded the use of very small aperture antennas in most radio receiver applications, including RFIDs and zero-power receivers, is that the input stage of the receiver should be impedance-matched to the very low impedance of the small aperture antenna.

Embodiments of the present invention provide zero-power receivers in which the input impedance of the receiver makes a good match to a very small aperture antenna. This can be accomplished by implementing bandpass filter 14 with a custom Surface Acoustic Wave (SAW) filter. Alternatively, the impedance match can be accomplished by implementing impedance transformer/demodulator 16 with a pyroelectric demodulator. Each of these approaches will be described in turn below.

In a SAW filter, an electrical input signal is converted to an acoustic wave, and then back to an electrical output signal, in a piezoelectric crystal. The input and output transducers are typically interdigitated transducers (IDTs). An IDT includes a pair of comb-shaped electrodes whose fingers interlock in an alternating arrangement.

In a SAW filter that is customized for the application described here, the input interdigitated transducer (IDT) is designed to have a very low input resistance to match to the antenna with little or no additional matching circuitry. This can be done by designing the SAW IDT to make use of parallel driver elements. Because of the parallel driver elements, the input of the filter can present a low resistance element with little parasitic capacitance or inductance. The effect is to create a very small antenna that can be integrated with a small filter, demodulator and detector. For example a filter, demodulator and detector may be mounted in a package with dimensions as small as $\frac{1}{50}^{th}$ of the signal wavelength.

At least one narrowband filter should be used within the detection chain of the zero-power receiver. Its purpose is to limit the input reception range to that of the signal of interest. In addition to providing an impedance match for an antenna, bandpass filter 14 should possess the highest possible performance in terms of insertion loss and passband bandwidth. The passband bandwidth is normally expressed in terms of Q or the ratio of total bandwidth covered divided by bandwidth passed.

Conventional multi-element or resonator types of filters used in microwave signal processing do not possess the necessary circuit Q to provide adequate performance for a long-range zero-power receiver. Ideally, the bandwidth of the bandpass filter should be just wide enough to accept the expected modulation of the input signal. This is because any additional bandwidth will admit noise which will obscure detection of the signal.

The Q factor of a typical high-performance RF or microwave filter is less than 100. In other words (referring to the well-known definition of Q), the center frequency is less than 100 times the bandwidth of the filter. By way of illustration, a filter with a Q of 100 and a center frequency of 1 GHz has a passband that is 10 MHz wide. The passband of the filter broadens with decreasing Q.

Typically, both much higher and much lower frequencies are blocked by additional filtering elements. A 10-MHz passband filter connected to an isotropic antenna with unity gain will see 41 fW of thermal noise alone. This is nominally a small amount of power, but it gives rise to a peak voltage of around 900 mV across a $10^{13}\Omega$ MOSFET gate, if it is losslessly transformed from the free-space impedance to the high impedance of the gate.

The Q of a narrowband filter desired for the receiver of a long-range zero-power receiver should be at least 100,000 when operating at high RF or microwave frequencies. A filter with a center frequency at 1 GHz and a Q of 100,000 will have a bandwidth of 10 kHz. This filter will admit 41 aW of thermal noise when connected to an isotropic antenna, and this will produce 29 mV peak across a $10^{13}\Omega$ MOSFET gate. This is approximately one times $V_{th}$ and should be the maximum thermal noise tolerated in a zero-power receiver.

An example of a high Q filter suitable for use as one filter element in a zero power receiver is a surface acoustic wave (SAW) filter. For example a SAW filter may have a 3-dB bandwidth of about 1.3 MHz with a center frequency of 2.60 GHz, giving it a Q of about 2000. It may have an input impedance of 55Ω and an output impedance of 57Ω, a reasonably good match for a dipole antenna's 73Ω impedance. The insertion loss should be low to improve the range of a zero-power receiver using the SAW filter. When a high-Q SAW such as this is used in conjunction with a crystal filter with a typical Q of 1000-2000, the combined circuit Q is well over the 100,000 desired minimum.

Crystal filters are available as common off-the-shelf components, but commercially available crystal filters are deliberately detuned to lower the Q and increase the passband. A custom crystal filter with a Q of 10,000 to 100,000 is desirable as a lower frequency filter in a zero-power radio receiver.

The next element following bandpass filter 14 in the zero-power receiver is impedance transformer/demodulator 16. It serves the purpose of stepping the signal from microwave frequency to intermediate or baseband frequency, depending on whether the receiver is a single-stage or a two-stage device. Recall that the first embodiment is an example of a single-stage zero power receiver, whereas other described embodiments are examples of two stage zero power receivers.

The device following the bandpass filter should accomplish two additional steps. First, it should transform the signal from the impedance of the microwave components (typically 50Ω to 300Ω) to the impedance of the intermediate or baseband frequency components (typically 100Ω to $10^{12}$Ω). Second, it should demodulate the RF or microwave signal and transform it into a lower frequency signal to be provided to high input impedance detector 18 (on the order of $10^{12}$Ω). That is, it should demodulate the signal by removing the microwave carrier and leaving behind the signal modulation at the baseband frequency. This should be accomplished because the microwave or RF signal will be greatly attenuated by any parasitic capacitances in a high-impedance environment (generally, more than 10Ω).

One way to meet these requirements is to implement transformer/demodulator 16 with a pyroelectric demodulator. In a pyroelectric demodulator, an amplitude-modulated electrical input signal generates heat in a resistor. The heat is conducted through a pyroelectric element to generate a base-band or intermediate frequency (IF) electrical output signal.

Figure 2:
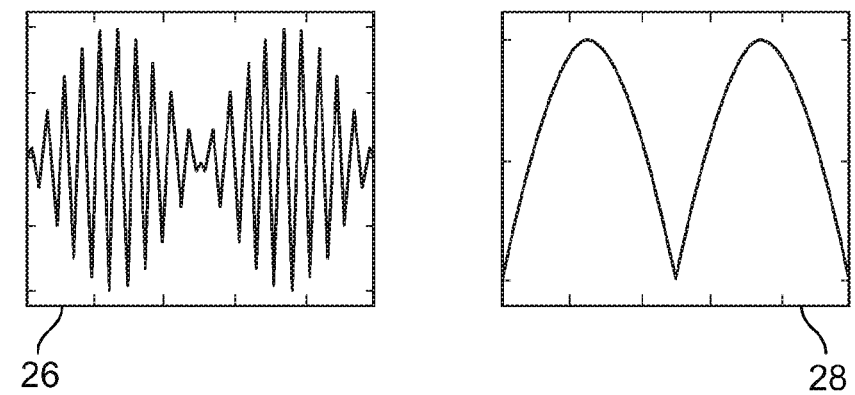
FIG. 2 illustrates a pyroelectric demodulator.
Figure 2:
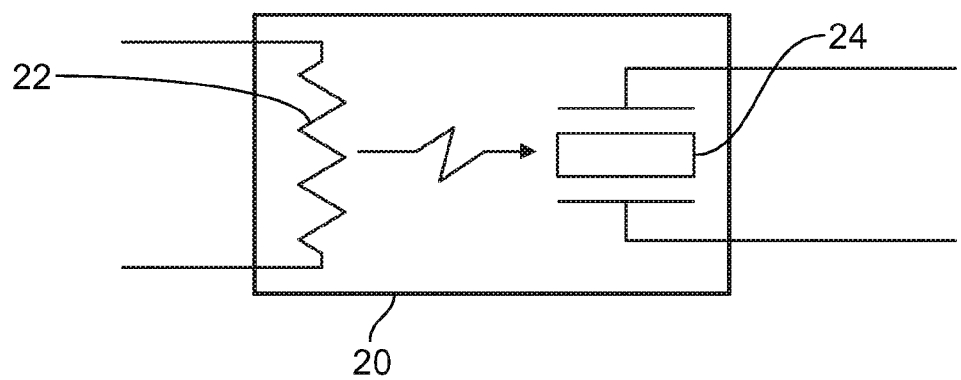

A pyroelectric device or demodulator is illustrated in FIG. 2. Pyroelectric demodulator 20 presents pure resistive load 22 to the filter or antenna that it is attached to. Its input resistance can be designed or trimmed to be the exact value desired to form a match to the input device. Pyroelectric demodulator 20 accepts an amplitude modulated RF signal across its input resistor 22. Input resistor 22 is thermally isolated from any path of heat transfer except through pyroelectric crystal or element 24 underneath it. Resistor 22 heats and cools rapidly, driven by the modulated RF signal (shown in graph 26). Resistor 22 is tiny enough to heat up and cool down very rapidly. It is small enough to heat up and cool down fast enough to follow the modulation of the incoming RF signal, but not fast enough to follow the RF signal itself. As a result, the temperature variation of resistor 22 follows the modulation curve of the RF signal (shown in graph 28).

Pyroelectric crystal 24, which underlies resistor 22, responds to a temperature gradient across it by producing an output voltage that follows the alternating temperature gradient across the crystal. Pyroelectric crystal 24 behaves like a capacitor with a very low leakage current. In electrical terms, it looks like a capacitor in parallel with a very large resistor, typically about $10^{12}$Ω. This means that it is possible to transfer power from an RF source at 50Ω to the input of a MOSFET transistor with an input resistance of $10^{12}$Ω.

Figure 3A:
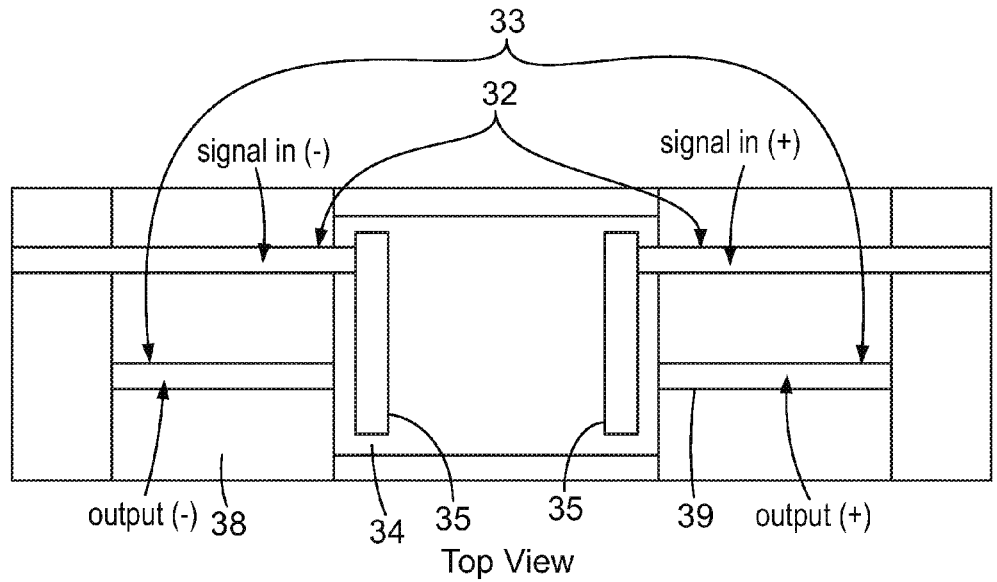
FIGS. 3A and 3B illustrate a top and side view, respectfully, of a pyroelectric demodulator integrated circuit fabrication geometry.
Figure 3B:
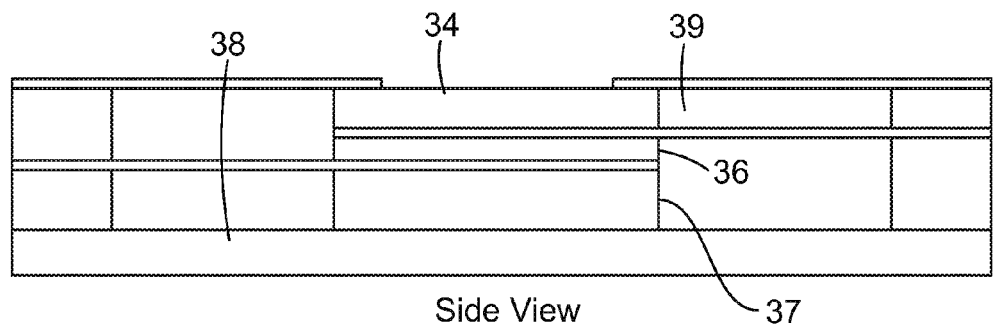

If pyroelectric demodulator 20 is fabricated using micromachining techniques to limit undesirable heat loss paths, as shown in FIGS. 3A and 3B, then nearly all of the input power can transfer to the output with an enormous potential voltage gain. A MEMS integrated version of the pyroelectric demodulator geometry is illustrated in FIGS. 3A and 3B. The demodulator is a two-port microwave device with input port 32 and output port 33. The input and output leads may be made from metal or a highly conductive polysilicon. Input port 32 accepts the microwave signal, which is an amplitude-modulated microwave sinusoid, and output port 33 provides a demodulated output signal.

Top layer 34 of the structure consists of a thin-film resistive material. The material can be any material normally used in making thin-film resistors, such as NiCr or TaN.

Input leads 35 to the resistor should be thermally isolated in order to contain and direct the flow of thermal energy dissipated in the resistor. The objective is to thermally isolate the microwave signal in the resistor in all directions except one. The thermal energy should be forced to travel through thin pyroelectric layer 36 into heat sinking substrate 37.

Pyroelectric layer 36 may be made from a material such as GaN. This can be accomplished by using MEMS processing to thermally isolate the detector in all directions except downward. An anisotropic etch can be used to remove substrate material along the walls of the demodulator. Any heat dissipated in the resistor will be forced to travel down very quickly through the pyroelectric material and into heat-sinking substrate 37 such as a metal ground plane or silicon pedestal. Connections using suspended bridge structures made of metal or polysilicon can also be created using MEMS processing to further thermally isolate the detector. Layer 38 is a thermal layer made from materials such as Si or Diamond.

Layer 39 immediately under the thin film resistor is the electrode material for the pyroelectric sensing layer. This should be a thin layer of metal or doped, highly conductive polysilicon that is isolated from the overlying thin film resistor by a very thin layer of insulator, such as $Si_2O_3$ or SiN. This will serve to electrically isolate the two ports. Capacitive coupling between the microwave input signal line and the demodulated output signal line will still give some coupling. This can be minimized by keeping the thin film resistor relatively thick and using a low dielectric coefficient material for the resistor.

The pyroelectric demodulator operates by first converting the electrical energy present in an amplitude modulated microwave signal into thermal energy. An illustrative microwave input signal is shown in graph 26 of FIG. 2. This signal is introduced at input port 32. Its electrical energy is converted to thermal energy. The thermal energy from the microwave signal will couple out of the resistor, principally flowing in the downward direction. The dimensions, geometry, and material type principally of the underlying layers govern the time response of this thermal transfer.

This thermal energy will create a temperature difference across the underlying pyroelectric layer 36. Pyroelectric layer 36 will convert the temperature difference into a voltage difference across output port 33 with a very short time lag, on the order of 1 psec for very small pyroelectric demodulators. An illustrative output signal is shown in graph 28 of FIG. 2. The thermal transfer across the pyroelectric layer can occur with an extremely fast response time. The objective is to tailor the thickness and other dimensions of the pyroelectric layer so that the thermal transfer across it occurs at a rate that is greater than or equal to the maximum modulation bandwidth of a signal of interest.

Referring back to FIG. 1, one of the advantages of an embodiment of the current invention arises from the very large transformation in impedance available by using pyroelectric demodulator 20 with a separate low threshold-voltage, high impedance field effect transistor (typically a MOSFET or JFET) as detector 18. The MOSFET transistor provides an input impedance of $10^{12}\Omega$, giving a very large voltage gain from the transformation from the input impedance of $50\Omega$. This provides a huge advantage in range over which the zero-power receiver can operate.

Also, the MOSFET transistor can be designed with a threshold voltage tailored to the application. For the design of a zero-power receiver, the threshold voltage should be set to about 100 mV, or 4Vth. FET devices exhibit a diode-like ID (drain current) versus VGS response with the threshold voltage, VT, behaving like the diode "knee voltage". The use of a high impedance MOSFET transistor will further lower the bandwidth of the received signal (and noise) and will serve to increase the range of a zero-power receiver that is used as a remote turn-on device.

One additional point about the design of the MOSFET detector is that it should be designed to have a primary gate leakage path to ground rather than to its drain, if the drain is pulled up to a positive voltage. This will cause the Rin of the MOSFET gate to shunt to ground rather than to Vcc. This can be achieved by using a lightly doped drain region in the fabrication of the MOSFET.

In one embodiment, a very sensitive zero-power radio receiver capable of detecting and decoding RF signals from a much greater range is made through the use of one or more pyroelectric demodulators in a zero-power receiver, paired with one or more very high Q, very narrowband filters, and a high input impedance detector. The combination of these elements provides a very large range advantage over traditional zero-power radio receiver approaches.

An advantage of the new approach is the large voltage gain that is achievable through the pyroelectric demodulator as it transforms the low input impedance of the RF environment into the high input impedance of the detector. By pairing a pyroelectric demodulator with a narrowband filter in front of it, the desired signal can be separated from background noise and can be given voltage gain while solely using the power contained in the received signal.

By using multiple stages of pyroelectric demodulators paired with narrowband filters, it is possible to demodulate to one or more IF frequencies before finally demodulating to the baseband frequency. The use of multiple stages with one or more IF frequencies enables filtering to a narrower final frequency than is possible using a single filter. That is, the use of multiple pyroelectric demodulator/filter pairs in cascaded stages downconverting to one or more IF frequencies in effect provides better signal detection and noise rejection than is possible using a single pyroelectric demodulator/filter stage. The use of multiple stages, in effect, offers a higher overall circuit Q than is achievable with a single filter.

Figure 4:
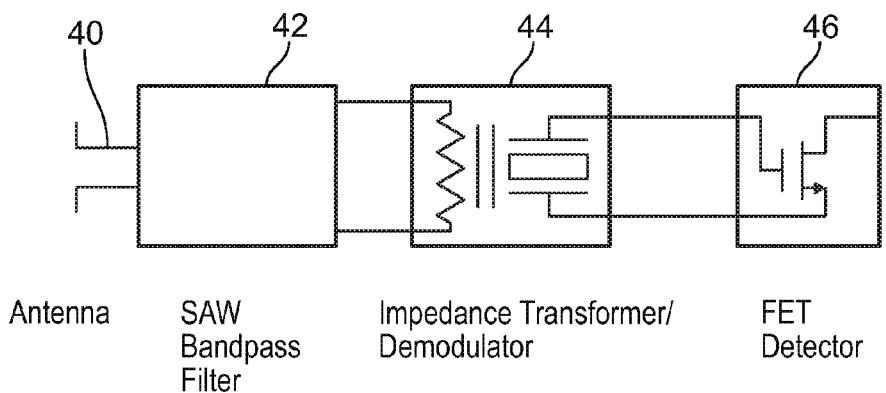
FIG. 4 illustrates a single stage embodiment.
Figure 5:
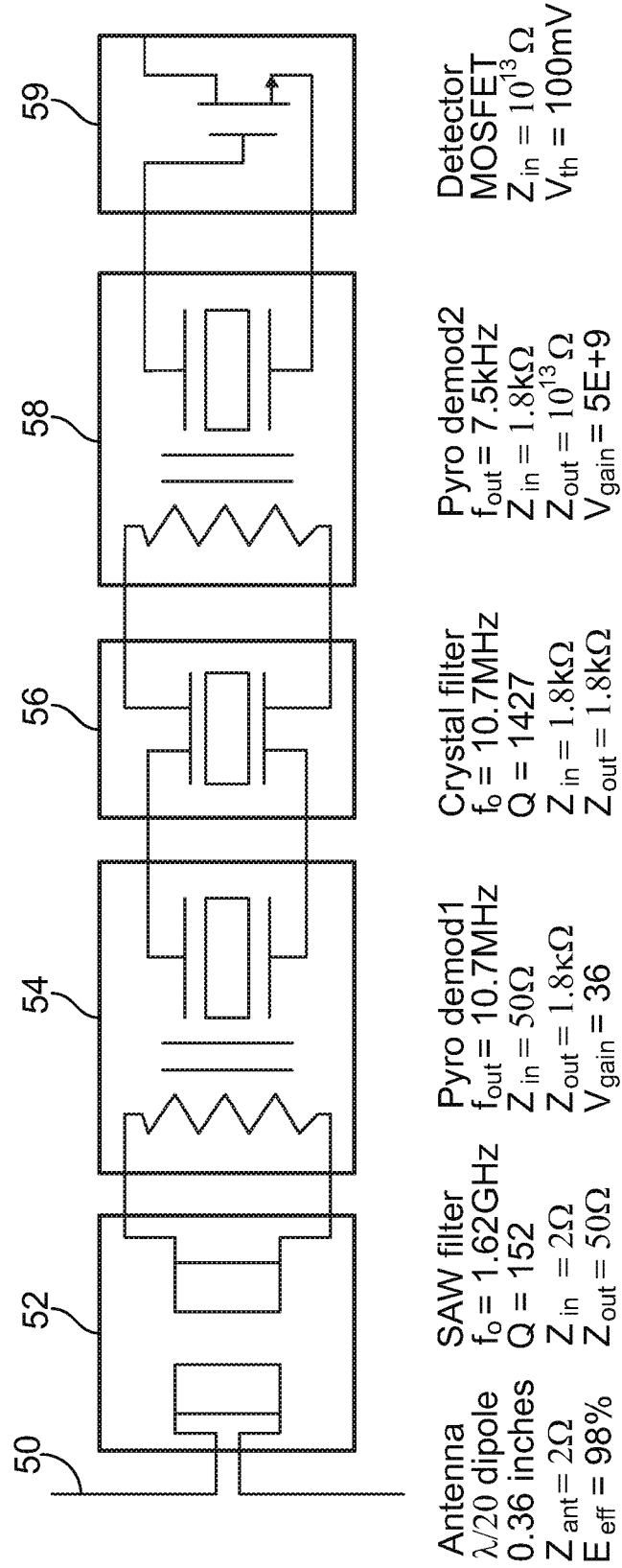
FIG. 5 illustrates an embodiment for a first satellite system zero power receiver.

FIG. 4 illustrates an embodiment having a single-stage implementation that combines antenna 40, narrowband SAW filter 42, pyroelectric demodulator 44, and FET detection transistor 46. FIG. 5 illustrates an embodiment having a two-stage implementation combining antenna 50, narrowband SAW filter 52, pyroelectric demodulator 54, crystal filter 56, second pyroelectric demodulator 58, and FET detection transistor 59. Other implementations are possible.

In either the single-stage or the two-stage implementation, an advantage is achieved by matching the input impedance of each stage to the output impedance of the preceding stage. That is, the input SAW filter should have an input impedance that is matched to the receiver's antenna. The input resistor used in the pyroelectric demodulator that connects to the SAW filter should be matched to the output impedance of that SAW filter. The pyroelectric demodulator then provides an impedance transformation to the following stage, whether it is a relatively low impedance crystal filter used in a multiple-stage design or a very high impedance FET transistor used in a single-stage design.

The detection transistor should be a very high input impedance device with a low threshold voltage and very low off-stage leakage current. This is typically best provided by a MOSFET or JFET transistor, but any device which has high input impedance, a tightly controlled, low threshold voltage, and a low leakage current will work.

The use of a custom SAW filter at the front end of the receiver provides an additional advantage in that it may be designed with a very low input impedance matched to a small-aperture antenna. The small-aperture antenna can be a very short dipole or very small loop antenna. It is not critical to use a short dipole or small loop antenna, but it offers the additional advantage of providing a very small antenna for use with the miniature zero-power receiver while still providing nearly the same effective aperture as a much larger antenna.

All of these components can be integrated on a single substrate, with or without an integrated antenna. The narrowband SAW filter, the pyroelectric demodulator, and a detector transistor can, for example, presently be made as small as 1 mm$^2$.

FIG. 5 illustrates the cascading of multiple filter/demodulator sections to achieve a narrower bandwidth reception than is possible using a single section. The output of the first filter/demodulator section will be an intermediate frequency (IF) rather than the baseband frequency. The output of the final filter/demodulator section is at the baseband frequency.

For example, one could create a two-stage design similar to FIG. 5 with the output of the first stage being at the commonly used 10.7 MHz IF frequency. The first section could consist of a SAW bandpass filter centered at the carrier frequency followed by a pyroelectric demodulator with input impedance matched to the output impedance of the SAW filter.

The output of the first pyroelectric demodulator will demodulate the carrier to the IF frequency of 10.7 MHz. The output of the pyroelectric demodulator will then couple into a very high Q crystal filter at the IF frequency. These are available commercially with low in-band insertion loss (typically <3 dB) and very high stopband attenuation (typically >65 dB).

The impedance of the crystal filter is typically a few kilohms, intermediate between the impedance of the RF section and the output detector. This provides an ideal level to step the voltage up partway from the input to the final output section. The output of the crystal filter is then followed by a second pyroelectric demodulator which transforms the impedance of the output of the crystal filter to the impedance of the detector. The impedance of the output detector is made to be as high as possible, about $10^{12}\Omega$.

For effective operation, the input signal should consist of a microwave tone at the carrier frequency with amplitude modulation at the IF frequency which is, in turn, modulated at the baseband frequency. It may be desirable to further encode the baseband signal to enable activation of a decoder by a coded signal. This will enable the coded activation of an individual device while rejecting appropriate signals without the correct code.

An additional modification of the zero-power receiver can provide for individual receiver identification. It is often desirable for an individual receiver to be able to reject in-band signals that are potentially spurious. That is, an advantage can often be gained by requiring a transmitter to send a coded signal to awaken a receiver. This can be achieved by adding a powered decoder chip to the receiver, as is done with most wireless access receivers, such as car alarms, home security systems, etc. However, it is also possible to add an unpowered SAW correlator to the back end of a high performance zero-power receiver to provide a coded unlocking mechanism.

A SAW correlator operates by summing the voltage of a time-delayed sequence of the input signal. The voltage resulting from the sum can be used as the final output to turn on a circuit that is external from the zero-power receiver. A SAW correlator can be designed to operate at a specific frequency chosen from a wide range of possible frequencies. It operates by summing phase-modulated or amplitude-modulated RF or microwave carrier signals. The addition of a SAW correlator to the zero-power receiver adds little to the physical area required to fabricate a receiver.

A series of detailed illustrative embodiments are presented next. The first is presented using the Iridium satellite network as the communication platform to a long-range zero-power receiver. The transmitter characteristics are those of a typical Iridium satellite. The receiver characteristics are those required by a zero-power receiver to be able to receive the signal from the Iridium network.

To solve the problem of receiving a signal from the Iridium satellite using a zero-power receiver, we now examine one possible implementation illustrated in FIG. 5, that might also be thought of as a "grain-of-rice" receiver. This receiver uses small dipole antenna 50. At the 1.62-GHz operating frequency of the Iridium satellite, a $\lambda/20$ dipole antenna (0.365 inches long) can be constructed from 24 gauge wire that still gives an antenna radiation efficiency of 98.5%. That is, the antenna loss resistance of $0.031\Omega$ lies far enough below the antenna radiation resistance of $1.974\Omega$ that the radiation efficiency is still excellent, if the antenna is impedance matched to the input of the receiver. The antenna effective area is 40.3 cm$^2$, very close to that of a $\lambda/2$ dipole with an effective area of 40.9 cm$^2$. What this means is that the receiver will work about as well with the $\lambda/20$ dipole as with a $\lambda/2$ dipole, if the input impedance of the receiver is made to be about $2\Omega$. The same effect can be achieved using a very small loop antenna, a very small patch antenna, or another small aperture antenna, provided that the antenna effective area can be maintained and that the antenna can be impedance matched to the front end of the receiver.

SAW filter 52 is at the front end of the receiver, and its input impedance can be tailored match the antenna. In this case, the SAW filter can be designed to have a center frequency of 1.62 GHz, a bandwidth of 10.7 MHz, an input impedance of $2\Omega$, an output impedance of $50\Omega$, an effective voltage gain of about 20×, and a power insertion loss (IL) of less than 2 dB. A resonator design would be best for achieving these characteristics.

The SAW filter will be followed by pyroelectric demodulator 54 with an input resistor of $50\Omega$ and a power insertion loss of less than 3 dB. This provides an ideal voltage gain of 36× or an effective voltage gain of 25×, considering the maximum insertion loss of 3 dB. Its output will be shunted by the 1.8-k$\Omega$ resistance that forms the input impedance of crystal filter 56, to which it is connected. The particular filter specified here is the ECS-10.7-7.5D, a monolithic 10.7 MHz crystal filter with a 10.7 MHz input frequency, a 7.5 kHz output frequency, a 4 dB (maximum) insertion loss, and 90 dB stopbands. The crystal IF filter provides a very high degree of out-of-band noise rejection.

Crystal filter 56 is followed by second pyroelectric demodulator 58 with an input resistor of 1.8 k$\Omega$ and a power insertion loss of less than 3 dB. Second pyroelectric demodulator 58 transforms the input 1.8-k$\Omega$ impedance onto MOSFET detector 59 with an input impedance of $10^{13}\Omega$.

Total power loss through the receiver is less than 13 dB. Total ideal voltage gain through the receiver is $5\times10^{13}$, giving an effective voltage gain through the receiver of $7.5\times10^{11}$ including the power losses.

Noise at the input to the MOSFET is 11 mV (RMS) due to thermal sources. The turn-on threshold of the MOSFET is set to 100 mV. MOSFET parasitic capacitance shunting its high resistance limits effective bandwidth to no more than a few Hertz. This lowers the actual RMS noise at the input to the MOSFET to less than 1 mV (RMS) due to thermal sources.

Performance for this receiver is good with enough voltage (107 mV) to turn on the MOSFET. The receiver should be adequate to serve as a zero-power radio turn-on device operated from an Iridium satellite at peak transmitted power.

Figure 6:
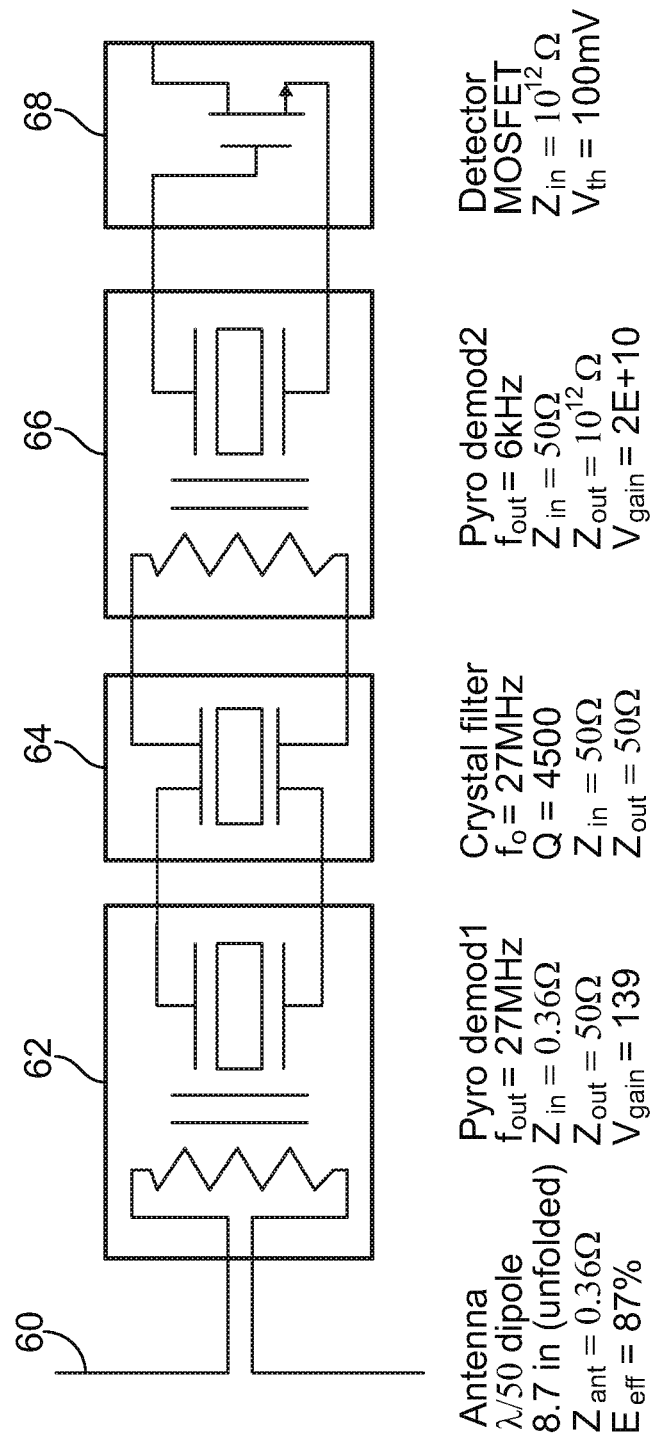
FIG. 6 illustrates an embodiment for a long range terrestrial zero power receiver.

The second illustrative embodiment is a very long range terrestrial zero-power receiver illustrated in FIG. 6. The receiver is designed to operate in the 11-meter band of the HF portion of the radio spectrum, at 27 MHz. In this portion of the spectrum, it is possible to obtain both sky-wave and multi-hop propagation, as the upper portion of the ionosphere can be reflective to radio waves incident at low angles. As a result, it is possible to communicate over the horizon at great distances using low power transmitters. Even without the sky-wave or ionospheric reflections, lower frequency communication links can be made at proportionally greater distances than higher frequency ones.

In this embodiment, the use of a very small antenna is desirable. This is because a wavelength at 27 MHz is 11 meters long. For this example, very short dipole antenna 60 was chosen, although a small loop antenna or small patch antenna will also work. The objective was to create an antenna that is much smaller than a half-wave dipole while still having the nearly the same effective area.

The advantage to using such an antenna is that it enables communication at low frequencies while still permitting a small, portable receiver. The difficulty in using such an antenna is that one should impedance match to its very low input impedance. However, matching to a very low input impedance can be easily done using pyroelectric demodulator 62. This is because the input to the pyroelectric demodulator is just a resistor. The pyroelectric demodulator works as effectively with a low value resistor as with a high value one.

A $\lambda/50$ (8.75 inch) dipole was designed using 18 gauge wire. In practice, the antenna would normally be printed as metal strips with folded arms. The resulting antenna will be about the size of a credit card, with an input impedance of $0.36\Omega$. In practice, such an antenna will also have a reactive component of impedance which will need to be tuned to resonance at the operating frequency.

The receiver is designed using two custom pyroelectric demodulators 62 and 66, crystal filter 64, and MOSFET transistor 68. The pyroelectric demodulators serve primarily as impedance transformers. Pyroelectric demodulator 62 transforms from $0.36\Omega$ to $50\Omega$ at the input to crystal filter 64.

Pyroelectric demodulator 62 does not actually demodulate the signal, it only transforms the signal from a low impedance environment to a high impedance environment. In this case, the pyroelectric demodulator does not demodulate the signal, because it is designed to have a modulation bandwidth that is greater than the input signal frequency. Consequently, its output follows the RF input signal.

This aspect of this embodiment is different from that of the other embodiments presented. Crystal filter 64 is a Vectron MQF 27.0-0600/03 with 4 dB insertion loss in-band, 60 dB out-of-band attenuation, 6 kHz bandwidth, and 50Ω input and output impedance.

This receiver would perform better with a custom crystal filter with narrower bandwidth. The reason is that the 11-meter band is a heavily used portion of the spectrum. One could design a custom crystal filter at 26.95 MHz, between channels in the band.

Crystal filters can easily have Q factors of 10,000 to 100,000. Commercial crystal filters are deliberately designed to have lower Q factors and wider bandwidths. For the purpose of a zero-power receiver to perform a wake-up task, to decode an identification message, or to transmit a low bandwidth message, a much narrower bandwidth is advantageous. A narrow bandwidth filter cuts down on both white noise and interferers. The commercial filter was used in the example calculation for simplicity.

A more significant point is that the combination of the input resistance of MOSFET 68 with its parasitic capacitance limits bandwidth to no more than a few Hertz. When this is factored into the signal reception calculations, the RMS noise due to thermal sources effectively disappears.

At the output of crystal filter 64, pyroelectric demodulator 68 serves to both transform the impedance and to demodulate the signal. The impedance at this stage steps from 50Ω to $10^{12}$Ω.

MOSFET 68 can then serve as a turn-on device or as a driver to a slow identification decoder. The RF signal should have a very slow modulation of no more than several Hertz, and its carrier frequency should be exactly within the bandwidth of the crystal filter. This point can greatly aid in eliminating interferers. A very narrowband, custom crystal filter can be used with terrestrial transmitters or geosynchronous satellites (which are not affected by Doppler shifts like low earth orbit satellites). Then, only the transmitter of interest is likely to be within that bandwidth. With a very narrowband crystal filter, modulation or intermodulation effects of out-of-band interferers are much less likely to pose a problem.

This credit-card sized receiver can serve as a remote turn-on device operated from a low power terrestrial-based transmitter at 1500 km, or even farther for a higher power transmitter or under favorable atmospheric conditions. The receiver will be more selective about rejecting interferers if the output is followed with a powered identification decoder. Such a device can be built that runs for years from a watch battery, since it is operating at a very low data rate.

The high input impedance of the MOSFET detector in this design combines with its parasitic capacitance and the output capacitance of the pyroelectric demodulator to lower the bandwidth to a few Hertz. If a lower-impedance detector is used for the receiver, this will increase the bandwidth of the receiver. A wider bandwidth signal can then be used, provided the device at the output of the detector can work with the lower voltage output available. For instance, a piezoelectric speaker could be attached to the output of the second pyroelectric demodulator to enable audio reception from the receiver. The resulting receiver would be like a crystal set radio, except that it would have a much greater range and much greater frequency selectivity.

Figure 7:
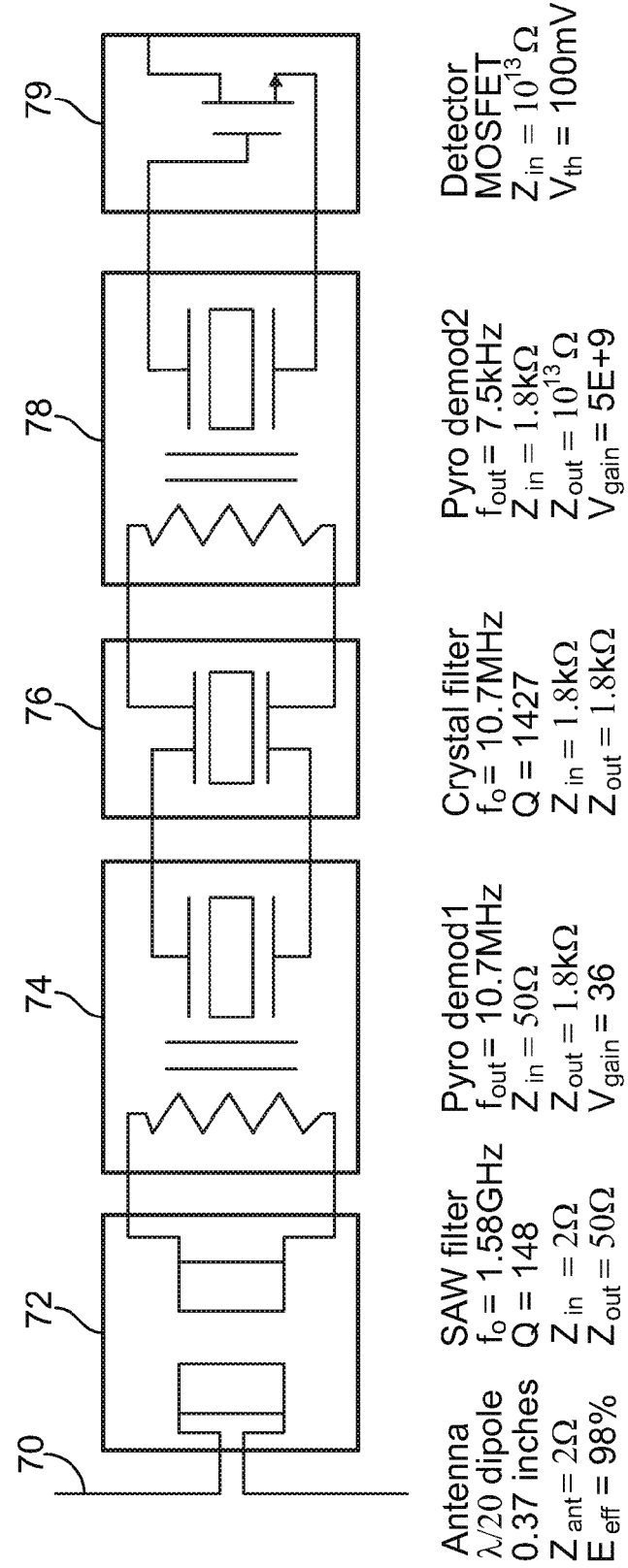
FIG. 7 illustrates an embodiment for a second satellite system zero power receiver.

Another illustrative embodiment is a zero-power receiver for an Inmarsat satellite-based transmitter illustrated in FIG. 7. The satellite used here is an Inmarsat IV, which is part of the Inmarsat commercial communications service. Inmarsat satellites sit at a distance of 35,600 km above the surface of the earth. They transmit at 1.575 GHz with +28.2 dBW of power. These satellites are capable of transmitting in a high gain "spot mode" using antennas with +24.2 dBi of gain that cover terrestrial footprints several hundred kilometers across. This is the primary mode of interest, as it offers substantially better performance over the antennas with full global coverage.

The receiver is similar to the one envisaged for the Iridium satellite, even though the two satellites are very different. The receiver is a two-stage design consisting of two cascaded filter/pyroelectric demodulator pairs. The input is a λ/20 (0.37 inch) dipole antenna 70 with a 98% radiation efficiency and 2Ω impedance. Antenna 70 has an effective area of 42.4 $cm^2$, which is 98.5% of the effective area of a much larger half-wave dipole. Note that the antenna effective area is defined as the ratio of the available power at the terminals of a receiving antenna to the power flux density of a plane wave incident on the antenna from that direction.

To capture this power available at the antenna terminals, SAW filter 72 that is attached to it should have a matching input impedance. That is, the SAW input IDT should be designed to have $Z_{in}$=2Ω. SAW filter 72 should have a bandwidth at least equal to the IF frequency of crystal filter 76 that follows it. Pyroelectric demodulator 74 that follows SAW filter 72 will serve to demodulate the amplitude modulations of the 1.58-GHz incoming signal to the IF frequency of 10.7 MHz. It will also transform the impedance from the output impedance of SAW filter 72 to the input impedance of crystal filter 76.

Crystal filter 76 specified for this receiver is the same as the one specified for the Iridium satellite receiver, the ECS-10.7-7.5D. This filter requires a 1.8-kΩ resistor connected shunting its input and output. The shunt resistor should be considered to be included in the packaging for the filter and should be considered to be included in the representation of the filter diagram. Since the input connects to the very high impedance of the output of pyroelectric demodulator 74, it needs a separate resistor connected in shunt to ground. The output of crystal filter 76 connects to the input of the second pyroelectric demodulator 78, which has its own 1.8-kΩ resistor built into its front end. As with the Iridium satellite receiver, use of a custom crystal filter would improve performance by limiting noise to a narrower bandwidth than provided by the off the shelf ECS-10.7-7.5D filter.

Second pyroelectric demodulator 78 serves to demodulate the IF and to transform the impedance from the 1.8 kΩ of the crystal filter to the $10^{13}$Ω at the input to MOSFET detector 79. The parasitic capacitance at the input to the MOSFET detector, combined with its input resistance of $10^{13}$Ω limits the available bandwidth at the output of the detector to a few Hertz. This both limits the bandwidth of the signal that can be used at the output of the detector, and it also limits the noise and interference that will appear there.

This limitation does limit the uses to which the receiver can be applied. However, it can be used as a wake-up device for a powered radio receiver or any other powered device. It can also serve to receive long, low data-rate messages. It can work with a wide variety of very low powered devices in this manner. These low powered devices may not need batteries, as sufficient power can usually be collected parasitically from the device's surrounding, if the device's power needs are not too great.

The output of the receiver can also interface with biological systems such as neurons or other electrically stimulated cells. The receiver can interface directly with nerve cells by forming a contact connection from the zero power receiver's metal electrodes to the nerve cell membrane. These typically have switching voltages of about 75-80 mV and switching speeds that should be no more than a few tens of Hertz. Both the levels and the operating frequencies of neurons are similar to those of the zero-power receivers described. Also, some of the components used in the zero-power receivers can be made to be the same size as a neuron. For example, the output MOSFET transistor can easily be made as small as or smaller than the smallest neurons. As a result, zero-power receivers may be used to signal biological systems such as neurons, muscles or other cells.

Figure 8:
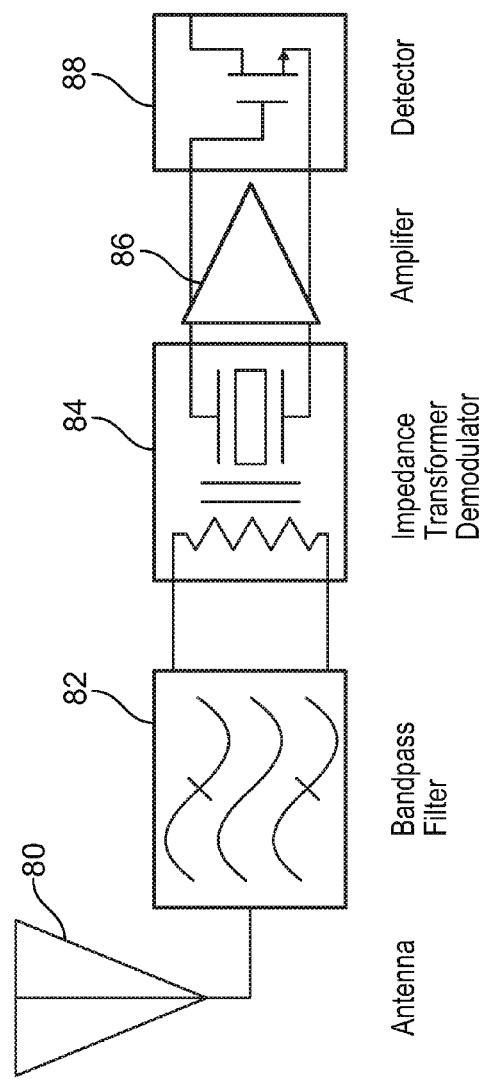
FIG. 8 illustrates a single stage embodiment with a low power-low frequency amplifier.
Figure 9:
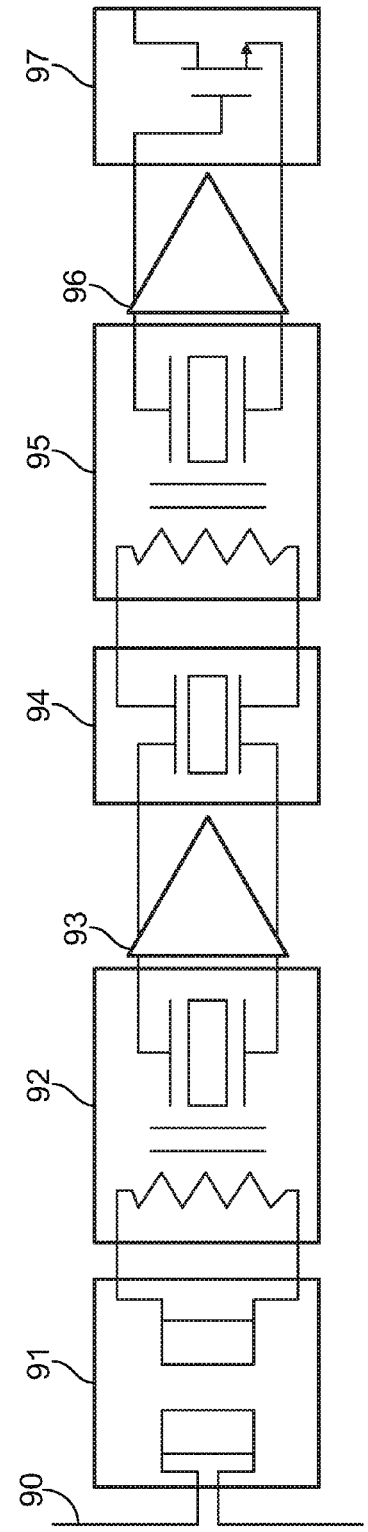
FIG. 9 illustrates a multiple stage embodiment with low power-low frequency amplifiers.

FIGS. 8 and 9 illustrate ultra-low-power embodiments using low-power, low-frequency amplifiers. These amplifiers operate at DC or low frequencies to obtain very high gains with very little power. Not all applications can tolerate the presence of a battery, but in those that can, one can greatly boost the range and/or output signal level by the addition of one or more low-power, low-frequency amplifiers. This approach differs from that used in a conventional RF receiver, in that conventional RF receivers typically use an RF amplifier, which consumes much higher power for even a small amount of gain.

FIG. 8 illustrates a single-stage embodiment using a low-power, low-frequency amplifier. An input signal from antenna 80 is received by bandpass filter 82. The output of bandpass filter 82 is received by pyroelectric device 84, which performs amplitude demodulation and transforms the output impedance of bandpass filter 82 to the input impedance of amplifier 86. This transformation is accomplished by using a pyroelectric device that has an input impedance that is approximately the same as the output impedance of bandpass filter 82 while also having an output impedance that is approximately the same as the input impedance of amplifier 86. Amplifier 86 is a low-power, low-frequency amplifier. The output of amplifier 86 is received by detector 88, which for example, may be a FET such as a JFET or MOSFET.

FIG. 9 illustrates a multiple-stage embodiment using multiple low-power, low-frequency amplifiers. This case offers a two-stage embodiment. Antenna 90 provides an input to bandpass filter 91, is implemented using, e.g., a SAW device. The output of bandpass filter 91 is provided to the input of pyroelectric device 92, which provides an input to amplifier 93. Amplifier 93 is a low-power, low-frequency amplifier.

Pyroelectric device 92 performs amplitude demodulation and impedance transformation between the output impedance of bandpass filter 91 and the input impedance of amplifier 93. Bandpass filter 94 receives an input from amplifier 93. Bandpass filter 94 may be implemented using a crystal filter. The output of bandpass filter 94 is provided to the input of pyroelectric device 95, which provides an input to amplifier 96. Amplifier 96 is a low-power, low-frequency amplifier. Pyroelectric device 95 performs amplitude demodulation and impedance transformation between the output impedance of bandpass filter 94 and the input impedance of amplifier 96. The output of amplifier 96 is received by detector 97, which for example, may be a FET such as a JFET or MOSFET.

The addition of one or more amplifiers to the zero-power radio receiver extends the physical range over which the receiver can operate. The amplifier is added to the zero-power receiver after the RF signal has been demodulated, where the operating signal frequency is much lower. This is in contrast to conventional radio communication receivers, which typically use one or more amplifiers operating at the carrier frequency.

One advantage of combining an amplifier with the zero-power receiver is that the resulting combination requires much less power than a conventional communication receiver. Power required for an amplifier is approximately proportional to the gain-bandwidth product. The gain-bandwidth product for an amplifier with a voltage gain of 10 operating at a carrier frequency of 1 GHz is 10 GHz. The gain-bandwidth product for an amplifier with a voltage gain of 1000 operating at the demodulated, baseband frequency of 10 Hz is 10 kHz, six orders of magnitude lower than for the much-lower gain amplifier operating at the carrier frequency. This lower gain-bandwidth product translates into proportionally lower power required for the amplifier.

A suitable amplifier to operate on the output of the pyroelectric demodulator may have characteristics such as an input impedance of 1 GΩ, DC gain of 1000, and power consumption of 3 microwatts (1 microampere from a 3.0-V battery). An amplifier required to operate at the carrier frequency of 1 GHz would typically have characteristics such as an input impedance of 50Ω, voltage gain of 10, and power consumption of 120 milliwatts (40 milliamperes from a 3.0-V battery). This is a factor-of-40,000 difference in power consumption.

In other embodiments of the present invention, the positions of the pyroelectric device and bandpass filter maybe interchanged.

The matter set forth in the foregoing description and accompanying drawings is offered by way of illustration only and not as a limitation. The actual scope of the invention is intended to be defined in the following claims when viewed in their proper perspective based on the prior art.

What is claimed is:

1. A zero power signal receiver, comprising;
   at least a first receiver stage to receive an input, the first receiver stage having a bandpass filter electrically connected to a first pyroelectric device having an input resistor and a first pyroelectric element thermally coupled to the input resistor;
   a detector receiving a detector input from a receiver stage to produce an output; and
   a second pyroelectric device having a second input resistor and a second pyroelectric element thermally coupled to the second input resistor, wherein the second pyroelectric device provides the input to the first receiver stage.

2. The zero power signal receiver of claim 1, further comprising an antenna wherein the second pyroelectric device provides an impedance transformation between an output impedance of the antenna and an input impedance of the first receiver stage.

3. The zero power signal receiver of claim 1, further comprising a second receiver stage wherein the first receiver stage provides an input to the second receiver stage.

4. The zero power signal receiver of claim 1, wherein at least one receiver stage has the bandpass filter electrically connected to the input resistor.

5. The zero power signal receiver of claim 1, wherein at least one receiver stage has an amplifier electrically connected to at least one of the bandpass filter and the first pyroelectric device.

6. The zero power signal receiver of claim 1, wherein at least one receiver stage uses the first pyroelectric device to perform amplitude demodulation.

7. The zero power signal receiver of claim 1, wherein the detector produces an output adapted to communicate with biological systems.

8. A zero power signal receiver, comprising:
- a first pyroelectric device having a first input resistor to receive an input signal, and a first pyroelectric element being thermally coupled to the first input resistor;
- a bandpass filter to receive an input from the first pyroelectric element;
- a second pyroelectric device having a second input resistor to receive an input from the bandpass filter, and a second pyroelectric element being thermally coupled to the second input resistor; and
  - a detector to receive an input from the second pyroelectric element and to produce an output.

9. The zero power signal receiver of claim 8, further comprising an antenna that provides the input signal to the first pyroelectric device.

10. The zero power signal receiver of claim 9, wherein the first pyroelectric device provides an impedance transformation between an output impedance of the antenna and an input impedance of the bandpass filter.

11. The zero power signal receiver of claim 8, wherein the second pyroelectric device performs amplitude demodulation.

12. The zero power signal receiver of claim 8, wherein the detector produces an output adapted to communicate with biological systems.

13. The zero power signal receiver of claim 8, wherein the detector comprises a FET.

14. A zero power signal receiver, comprising:
- a first bandpass filter to receive an input signal;
- a first pyroelectric device having a first input resistor to receive an input from the first bandpass filter, and a first pyroelectric element being thermally coupled to the first input resistor;
- a second bandpass filter to receive an input from the first pyroelectric element;
- a second pyroelectric device having a second input resistor to receive an input from the second bandpass filter, and a second pyroelectric element being thermally coupled to the second input resistor; and
- a detector to receive an output from the second pyroelectric element and to produce an output.

15. The zero power signal receiver of claim 14, further comprising an antenna that provides the input signal to the first bandpass filter.

16. The zero power signal receiver of claim 14, wherein the first pyroelectric device performs amplitude demodulation.

17. The zero power signal receiver of claim 14, wherein the second pyroelectric device performs amplitude demodulation.

18. The zero power signal receiver of claim 14, wherein the first bandpass filter comprises a SAW device.

19. The zero power signal receiver of claim 14, wherein the detector produces an output adapted to communicate with biological systems.

20. The zero power signal receiver of claim 14, wherein the detector comprises a FET.

* * * * *